United States Patent [19]

Ogura et al.

[11] Patent Number: 4,831,433

[45] Date of Patent: May 16, 1989

[54] SEMICONDUCTOR DEVICE

[75] Inventors: Mitsugi Ogura, Yokohama; Fumio Horiguchi; Shigeyoshi Watanabe, both of Tokyo, all of Japan

[73] Assignee: Kabushiki Kaisha Toshiba, Kawasaki, Japan

[21] Appl. No.: 226,532

[22] Filed: Jul. 27, 1988

Related U.S. Application Data

[63] Continuation of Ser. No. 717,646, Mar. 29, 1985, abandoned.

[30] Foreign Application Priority Data

Jul. 31, 1984 [JP] Japan .................................. 59-160517

[51] Int. Cl.[4] ...................... H01L 23/12; H01L 25/54; H01L 23/48
[52] U.S. Cl. ........................................ 357/68; 357/80; 357/75
[58] Field of Search ........................ 357/68, 45, 75, 70, 357/72, 80

[56] References Cited

U.S. PATENT DOCUMENTS 4,467,400 8/1974 Stopper ................................ 357/45

FOREIGN PATENT DOCUMENTS 0142544 8/1983 Japan ..................................... 357/45
0197747 11/1983 Japan ..................................... 357/45

Primary Examiner—Andrew J. James
Assistant Examiner—Sheila V. Clark
Attorney, Agent, or Firm—Finnegan, Henderson, Farabow, Garrett & Dunner

[57] ABSTRACT

A semiconductor device includes a rectangular semiconductor chip, first to fourth memory cell arrays formed on the semiconductor chip, and first to fourth bonding pads formed on the peripheral part of the semiconductor chip. In this semiconductor device in particular, first bonding pads are disposed along a first long side of the semiconductor chip while second bonding pads are disposed along a second long side of the chip. The first and second memory cell arrays are disposed between the first bonding pads and the second long side while the third and fourth memory cell arrays are disposed between the first long side and the second pads.

4 Claims, 2 Drawing Sheets

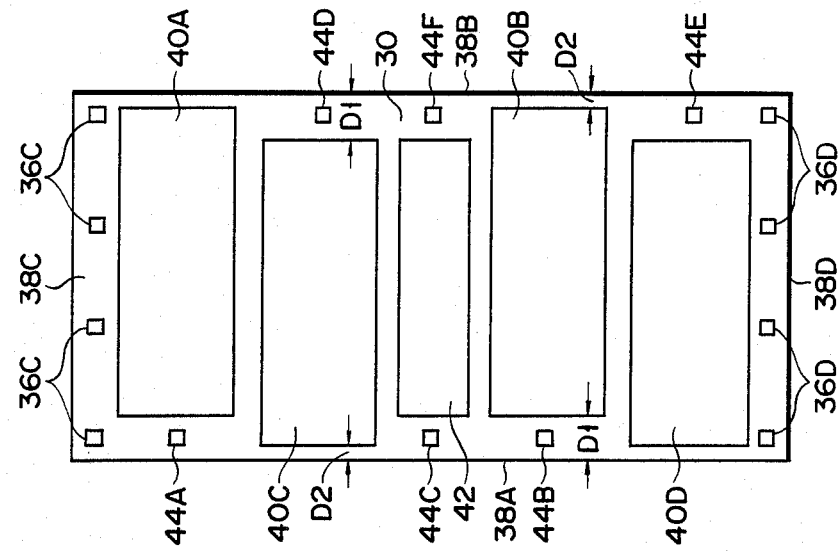
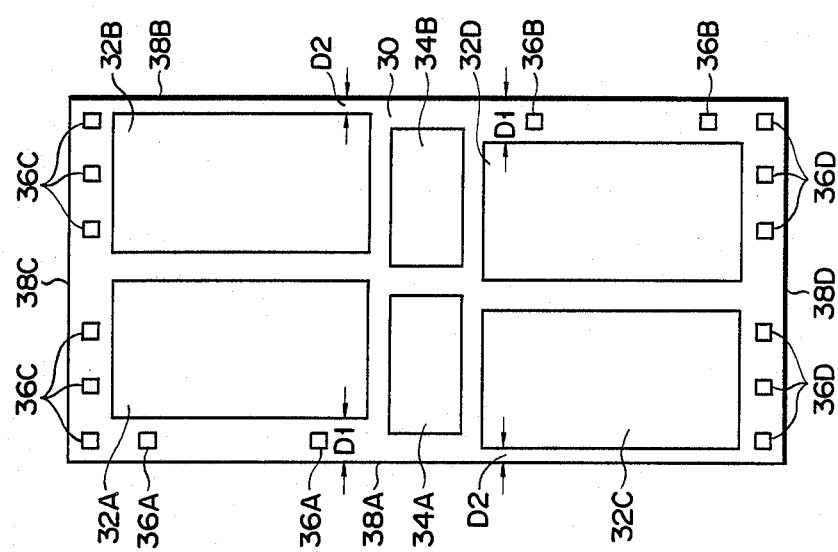

SEMICONDUCTOR DEVICE

This is a continuation of application Ser. No. 717,646, filed Mar. 29, 1985, now abandoned.

BACKGROUND OF THE INVENTION

The present invention relates to a semiconductor device and, more particularly, to a semiconductor device having a plurality of memory cell arrays.

Historically speaking, in a dynamic RAM device, a multiplex system is utilized for designating the memory locations. In this multiplex system, the memory address signal is divided beforehand into two address signals, i.e., row and column address signals. These row and column address signals are supplied to address pins of the dynamic RAM at different times. Where the dynamic RAM has the same memory capacity as that of, a static RAM, this dynamic RAM only requires half the number of address pins as the static RAM. When account is taken of the fact that the size of an IC package depends greatly upon the number of package pins such as, for example, address pins, the dynamic RAM is suitable for miniaturization of the package as compared with the static RAM. As far as the present is concerned, where the dynamic RAM has a memory capacity of, for example, 16K to 256Kbits, its memory chip (i.e., the semiconductor chip formed with a memory circuit) can be formed in a Dual In Line Package (DIP) having sixteen package pins and a width of 300 mil (7.62 mm).

The known types of the packages include, ceramic packages, plastic packages, sur-DIP packages, etc. Among these packages, the plastic package is most suitable for mass production and its manufacturing cost is low. The plastic package has a lead frame for connecting its memory chip to external circuits, and is constructed such that the memory chip is mounted on the lead frame, and is molded from plastic. In the case of the DIP package, in particular, the width of the memory chip is limited by the size of the lead frame used. When the memory chip is narrow, the layout of memory cells and peripheral circuits is not easy. Where the memory capacity of the dynamic RAM is increased up to, for example, 1 Mbit to 4 Mbit, it is necessary to make the size of the memory chip large, or to make the size of a memory cell small. When a DIP having a width of 300 mil is used, it is impossible to increase the size of the memory chip for the above-mentioned reason. For example, one memory cell is composed of one transistor and one capacitor. When these memory cells are formed at small intervals, the capacitance of these capacitors is decreased. This also results in a decrease in the reliability of the memory cell. When the capacitance of the capacitor is small, it is impossible to obtain a signal at a sufficiently high voltage level. In addition, software errors increase, which result from the electric charge within the capacitor being cancelled by the α rays which have temporarily been generated within the semiconductor element.

Next, the disposition of memory cell arrays and bonding arrays within the area of a memory chip will be explained with reference to FIGS. 1 and 2. In FIG. 1, a memory chip 10 is received in a ceramic DIP and bonding pads 12A and 12B are disposed on those portions of the memory chip 10 which are located along short sides 14A and 14B thereof, respectively. Further, memory cell arrays 16A to 16D are formed on the memory chip 10 in such a manner that they are extended to the neighborhoods of long sides 14C and 14D thereof. The reason why this disposition is adopted is as follows. Namely, where the ceramic DIP is used and when, in this case, the bonding posts are disposed along the long sides of its chip, since the thickness of the ceramic layer along the long sides can not be made thinner than 1 mm or so, the effective width of the chip along the short sides thereof is disadvantageously narrowed. For this reason, in the case of a ceramic DIP, the bonding posts are usually concentratedly disposed along the short sides of its chip. On the other hand, in the case of a plastic DIP such as that shown in FIG. 2, the bonding posts are disposed along the long sides, as well, of its chip because a lead frame must be disposed on one plane. In FIG. 2, a memory chip 20 is received in the plastic DIP. Bonding pads are formed on the peripheral part of this memory chip 20. Memory cell arrays 24A to 24D are surrounded on the semiconductor chip 20 by these bonding pads. If, in case the plastic DIP is used, the bonding pads are all formed on those portions of the memory chip which are located along the short sides thereof, bonding wires having a large length must be used as the bonding wires for connecting those bonding pads and a lead frame. In this case, however, defective connections are liable to be produced in the bonding step, or breakage of the bonding wires is likely to occur.

The bonding pads which are shown in FIG. 3 have a width of 100 to 130 $\mu$m. Taking the bonding errors into consideration, these bonding pads are provided such that they are spaced 30 to 50 $\mu$m from the sides of a memory chip, and from memory cell arrays as well. For this reason, the memory cell arrays are formed such that they are spaced from the long sides of the memory chip 20 by a distance D1 of about 200 $\mu$m. In FIG. 3, the width of the memory cell region (about 400 $\mu$m) is limited to a value which is smaller than the length of the short side of the chip. Therefore, where the memory capacity is as large as 1 Mbit, 4 Mbit, etc., it is difficult for the plastic DIP, having a width of 300 mil to receive the memory chip without the element characteristics deteriorating.

SUMMARY OF THE INVENTION

The object of the present invention is to provide a semiconductor device in which the area of its semiconductor chip can effectively be utilized as the element region and which (even when the width of this semiconductor chip is limited because its in a plastic DIP) enables the resultant elements to have a sufficiently high reliability in their operation.

According to the present invention, there is provided a semiconductor device which comprises a rectangular semiconductor chip having first and second long sides which oppose each other, at least one first element region formed on the semiconductor chip, the distance between the first element region and the first long side being larger than a specified value, the distance between the first element region and the second long side being smaller than said specified value, at least one second element region formed on the semiconductor chip, the distance between the second element region and the first long side being smaller than said specified value, the distance between the second element region and the second long side being larger than said specified value, at least one first bonding region formed between the first element region and the first long side, and at least one second bonding region formed between the second element region and the second long side.

According to the present invention, the first bonding region is formed between the first long side of the semiconductor chip and the first element region while, on the other hand, the second bonding region is formed between the second element region and the second long side of the semiconductor chip. Namely, neither the first bonding region nor the second bonding region are provided between the first element region and the second long side nor between the second element region and the first long side. For this reason, the first and second element regions can be formed such that they are sufficiently close to the second and first long sides, respectively. Accordingly, the limitation imposed upon the size of the circuit elements provided in each element region is mitigated to enable their operation characteristics to be enhanced. If, conversely, the size of the elements to be provided in the element region is fixed, it is also possible to increase the degree of integration in the first and second element regions.

BRIEF DESCRIPTION OF THE DRAWINGS

FIG. 3 shows a structure of a semiconductor device according to an embodiment of the present invention; and FIG. 4 shows a structure of a semiconductor device according to another embodiment of the present invention.

DESCRIPTION OF THE PREFERRED EMBODIMENTS

A semiconductor device according to an embodiment of the present invention will now be described with reference to FIG. 3. This semiconductor device is mainly a memory chip of a dynamic RAM which is in a plastic package. FIG. 3 shows a top view of this semiconductor device. This semiconductor device has a rectangular semiconductor chip 30 with memory cell arrays 32A, 32B, 32C and 32D, decoders 34A and 34B, and bonding pads 36A, 36B, 36C and 36D. The memory cell arrays 32A to 32D are equal in size to each other, and occupy most of the area of the semiconductor chip 30. The memory cell arrays 32A and 32B are formed along a short side 38C of the semiconductor chip 30, and are arranged between long sides 38A and 38B of this chip 30 in such a manner that both are opposed to each other. The memory cell arrays 32C and 32D are formed along a short side 38D of the semiconductor chip 30, and are arranged between the long sides 38A and 38B thereof in such a manner that they are opposed to each other. The decoders 34A and 34B are formed on a central part of the semiconductor chip 30 which is substantially equidistant from each short side 38C or 38D, and are arranged between the long sides 38A and 38B in such a manner that both decoders 34A and 34B are opposed to each other. The decoder 34A is located between the memory cell arrays 32A and 32C while the decoder 34B is located between the memory cell arrays 32B and 32D. The memory cell array 32A is spaced by a distance D1 of, for example, 200 μm from the long side 38A. The memory cell array 32B is spaced from the long side 38B by a distance D2 of, for example, 30 μm which is shorter than the distance D1. The memory cell array 32C is spaced by the distance D2 from the long side 38A. The memory cell array 32D is spaced by the distance D1 from each of the long side 38B. The distance D1 is a length which is long enough to prevent the bonding errors from causing damage to the neighboring circuit elements. The bonding pads 36A are formed on that portion of the semiconductor chip 30 which is located between the long side 38A thereof and the memory cell array 32A. The bonding pads 36B are formed on that portion of the semiconductor chip 30 which is located between the long side 38B thereof and the memory cell array 32D. The bonding pads 36C are formed on that portion of the semiconductor chip 30 which is located between the short side 38C and the memory cell arrays 32A and 32B. The bonding pads 36D are formed on that portion of the semiconductor chip 30 which is located between the short side 38D thereof and the memory cell arrays 32C and 32D. The memory cell arrays 32A to 32D, decoders 34A and 34, and the bonding pads 36A to 36D are connected to each other by a wire distribution pattern (not shown) so as to constitute a memory circuit.

Figure 2:
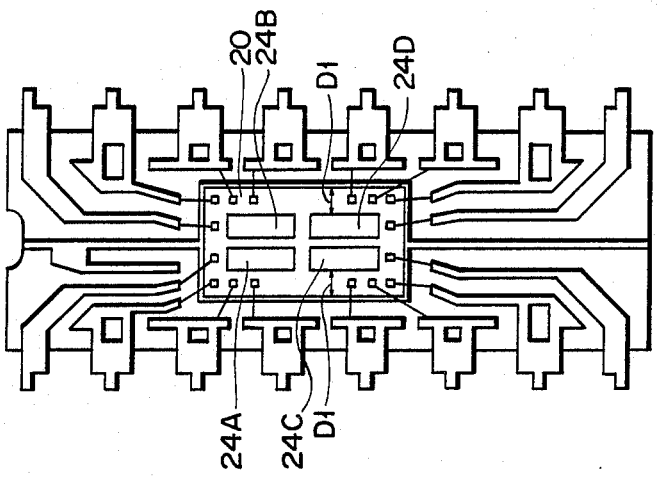
FIG. 2 shows a prior art RAM device having a structure wherein a memory chip is received in a plastic package.
Figure 1:
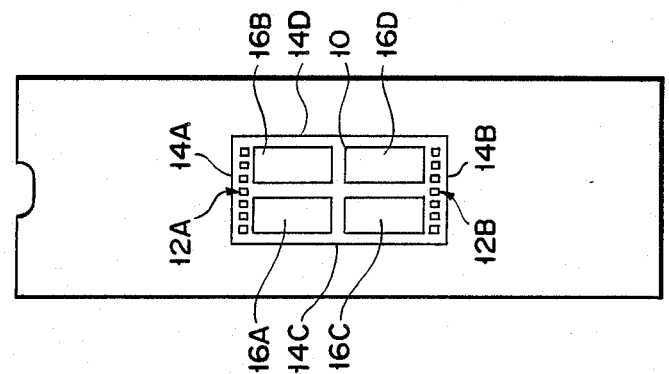
FIG. 1 shows a prior art dynamic RAM having a structure wherein a memory chip is received in a ceramic package.

In this semiconductor device, the space where the bonding pads are formed is not provided either between the memory cell array 32B and the long side 38B or between the memory cell array 32C and the long side 38A. Accordingly, when it is now assumed that the conventional memory chip shown in FIG. 2 is of the same size as the memory chip shown in FIG. 3, in the latter a larger area can be utilized as the memory cell region, than in the former. For this reason, memory cells of a larger size can be formed in the memory cell region of FIG. 3, than in the memory cell region of FIG. 2. If it is taken into consideration that, in the process of manufacturing the semiconductor device, some variations in the size of the capacitor in the memory cell occur, then the memory cells which are larger in size will permit their capacitors to have a higher capacitance, so that erroneous operations become uncommon. For example, in the reading operation, a large read signal is supplied from the capacitor into a sense-amplifier, therefore it can be amplified with a higher S/N ratio.

If the memory cells 32A to 32D are disposed as shown in FIG. 3, the wire distribution unavoidably becomes somewhat wide or lengthy. However, this does not remarkably increase the area required for such a wire distribution to be made, that is to say, the degree to which this increase occurs is ignorable.

According to this embodiment, where the width of the memory chip is extremely limited, for example, when the chip is received within a plastic DIP having a width of 300 mil, the resultant dynamic RAM will have a high reliability in respect to its operation because the area of that chip is utilized with high efficiency.

A semiconductor device according to another embodiment of the present invention will now be described with reference to FIG. 4. In FIG. 4 there is shown a top view of this semiconductor device. In FIG. 4, the same parts or portions as those shown in FIG. 3 are denoted by like reference numerals, respectively. This semiconductor device has on a rectangular semiconductor chip 30 memory cell arrays 40A to 40D, decoder 42, and bonding pads 36C, 36D, 44A to 44F. The memory cell arrays 40A to 40D are equal in size to each other, and occupy most of semiconductor chip 30. The memory cell arrays 40A and 40D are formed such that they are spaced from short sides 38C and 38D of the semiconductor chip 30, respectively, by a predetermined distance of, for example, 200 μm. The decoder 42 is formed on a central part of the semiconductor chip 30 in such a manner that it is spaced by the distance D1, for example 20 m, from each of the long sides 38A and 38B of this chip 30. The memory cell array 40B is disposed between the decoder 42 and the memory cell array 40D. The memory cell array 40C is disposed between the decoder 42 and the memory cell array 40A. The memory cell arrays 40A and 40B are spaced from the long side 38A of the chip 30 by the distance D1, and are also spaced from the long side 38B by a distance D2 of, for example, 30 μm. Note here that the distance D1 is a value which is great enough to prevent the bonding errors from affecting the neighboring circuit elements, as in the first-mentioned embodiment, and that its value is greater than the value of the distance D2, similarly. The memory cell arrays 40C and 40D are spaced by the distance D2 from the long side 38A of the semiconductor chip 30, and at the same time are spaced by the distance D1 from the long side 38B. The bonding pads 36C are formed on that portion of the semiconductor chip 30 which is located between the memory cell array 40A and the short side 38C of the chip 30. The bonding pads 36D are formed on that portion of the semiconductor chip 30 which is located between the memory cell array 40D and the short side 38D of this chip 30. The bonding pad 44A is formed on that portion of the semiconductor chip 30 which is located between the memory cell array 40A and the long side 38A of this chip 30. The bonding pad 44B is formed on that portion of the semiconductor chip 30 which is located between the memory cell array 40B and the long side 38A of the chip 30. The bonding pad 44C is formed on that portion of the semiconductor chip 30 which is located between the decoder 42 and the long side 38A of the chip 30. The bonding pad 44D is formed on that portion of the semiconductor chip 30 which is located between the memory cell array 40C and the long side 38B of the chip 30. The bonding pad 44E is formed on that portion of the semiconductor chip 30 which is located between the memory cell array 40D and the long side 38B of the chip 30. The bonding pad 44F is formed on that portion of the semiconductor chip 30 which is located between the decoder 42 and the long side 38B of the chip 30.

In the semiconductor device shown in FIG. 4, the area to be occupied by the memory cell arrays 40A to 40D on the semiconductor chip 30 can efficiently be secured, as in the case of the semiconductor device of FIG. 3.

The memory cell arrays 32A to 32D of FIG. 3 and the memory cell arrays 40A to 40D of FIG. 4 may be replaced by other circuits such as, for example, gate arrays, data processing circuit element arrays, etc. In this case, the semiconductor device ceases to function as a dynamic RAM, but the spirit of the present invention still remains.

What is claimed is:

1. A semiconductor memory device comprising:
    a rectangular semiconductor chip having a top surface and longitudinal and lateral sides;
    at least first, second, third, and fourth memory arrays positioned on said top surface in a staggered, eccentric configuration on said semiconductor chip relative to said longitudinal sides of said semiconductor chip such that a first edge of said first and third memory arrays are spaced a first predetermined distance from respective opposing longitudinal sides of said chip, and a first edge of said second and fourth memory arrays are spaced a second predetermined distance, less than said first predetermined distance, from each of said opposing longitudinal sides of said chip to form a narrow space and a wide space between said first edges of respective memory arrays and each said longitudinal side of said chip; and
    a plurality of bonding pads positioned on said top surface of said chip in said wide space between said first edges of respective ones of said memory arrays and respective longitudinal sides of said chip.

2. A semiconductor memory device according to claim 1, wherein each memory array is substantially rectangular with longitudinal and lateral sides and said lateral sides of said memory arrays are positioned opposite the longitudinal sides of said semiconductor chips.

3. A semiconductor memory device according to claim 1, wherein said memory arrays are spaced from said lateral sides of said semiconductor chip to form bonding spaces therebetween.

4. A semiconductor device comprising:
    a rectangular semiconductor chip having a top surface and longitudinal and lateral sides;
    at least first, second, third, and fourth element regions positioned on said top surface in a staggered, eccentric configuration relative to said longitudinal sides of said semiconductor chip such that a first edge of said first and third element regions are spaced a first predetermined distance from opposite longitudinal sides of said chip, and a first edge of said second and fourth element regions are spaced a second predetermined distance, less than said first predetermined distance, from opposite longitudinal sides of said chip to form a narrow space and a wide space between said first edges of respective ones of said element regions and each said longitudinal side of said chip; and
    a plurality of bonding pads positioned on said top surface of said chip in said wide region between respective first edges of said element regions and respective longitudinal sides of said chip.

* * * * *